United States Patent
Kang

(10) Patent No.: US 8,471,590 B2
(45) Date of Patent: Jun. 25, 2013

(54) CALIBRATING RESISTANCE FOR INTEGRATED CIRCUIT

(75) Inventor: Sin Deok Kang, Suwon-si Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 57 days.

(21) Appl. No.: 13/159,595

(22) Filed: Jun. 14, 2011

(65) Prior Publication Data

US 2012/0007632 A1    Jan. 12, 2012

(30) Foreign Application Priority Data

Jul. 8, 2010  (KR) .................. 10-2010-0066043

(51) Int. Cl.
*H03K 17/16* (2006.01)
*H03K 19/003* (2006.01)
*H03K 3/00* (2006.01)
*H03B 1/00* (2006.01)
*H03L 5/00* (2006.01)

(52) U.S. Cl.
USPC ......... 326/30; 327/109; 327/333; 365/189.05

(58) Field of Classification Search
USPC ............. 326/30; 327/108, 170; 365/189.05, 365/189.11
See application file for complete search history.

(56) References Cited

U.S. PATENT DOCUMENTS

| 6,762,620 B2 * | 7/2004 | Jang et al. .................. 326/30 |
| 7,368,936 B2 | 5/2008 | Huang |
| 7,986,150 B2 * | 7/2011 | Yokou ........................ 324/601 |
| 2008/0064981 A1 * | 3/2008 | Gregory ..................... 600/547 |
| 2009/0015290 A1 * | 1/2009 | Park ............................ 326/30 |
| 2009/0016124 A1 * | 1/2009 | Kim ........................... 365/194 |
| 2010/0134214 A1 * | 6/2010 | Matsui et al. .............. 333/22 R |
| 2010/0164540 A1 * | 7/2010 | Kwean ....................... 326/30 |
| 2011/0193590 A1 * | 8/2011 | Nakagawa et al. ......... 326/30 |
| 2011/0316604 A1 * | 12/2011 | Em ............................ 327/333 |

FOREIGN PATENT DOCUMENTS

KR   100884603 B1   2/2009

* cited by examiner

*Primary Examiner* — Shawki Ismail
*Assistant Examiner* — Dylan White
(74) *Attorney, Agent, or Firm* — William Park & Associates Patent Ltd.

(57) ABSTRACT

An integrated circuit includes a first ODT unit and an input buffer. The first ODT unit is configured to receive at least one pull-up code and at least one pull-down code for impedance matching of a first line through which data is transferred, and adjust a resistance value. The input buffer is configured to drive input data by buffering the data in response to a level of a reference voltage, wherein the driving of the input data is adjusted in response to the pull-up code and the pull-down code.

20 Claims, 8 Drawing Sheets

CALIBRATING RESISTANCE FOR INTEGRATED CIRCUIT

CROSS-REFERENCES TO RELATED APPLICATIONS

The present application claims priority under 35 U.S.C 119(a) to Korean Application No. 10-2010-0066043, filed on Jul. 8, 2010, in the Korean intellectual property Office, which is incorporated herein by reference in its entirety.

TECHNICAL FIELD

The present invention is directed to an integrated circuit and more particularly to calibrating a resistance of an on-die termination circuit.

BACKGROUND

In the field of integrated circuits, ensuring proper data input is necessary. Toward this end, data input margins and impedance calibration may play a role. Typically, a termination resistor having the same resistance value as a characteristic impedance is coupled to a receiving end or a transmitting end of a semiconductor device. The termination resistor suppresses the reflection of signals transferred through the transmission channel by matching the impedance of the receiving end or the transmitting end with the characteristic impedance of the transmission channel.

A conventional termination resistor is installed outside a semiconductor chip. Recently, an on-die termination (ODT) circuit in which a terminal resistor is installed inside a semiconductor chip has been used. Since an ODT circuit includes a switching circuit which performs an on/off operation to control a current flowing thereinside, power dissipation is lower than that of a termination resistor installed outside a semiconductor chip. The resistance value of the ODT circuit changes according to process, voltage and temperature (PVT) variation. Thus, before use, the resistance value of the ODT circuit is calibrated by using an impedance calibration (ZQ calibration) circuit.

SUMMARY

An embodiment of the present invention relates to an integrated circuit which is capable of ensuring a data input margin by controlling a level of a reference voltage and a driving of an input buffer by using codes generated from an impedance calibration circuit.

In one embodiment, an integrated circuit includes: a first ODT unit configured to receive at least one pull-up code and at least one pull-down code for impedance matching of a first line through which data is transferred, and adjust a resistance value; and an input buffer configured to drive input data by buffering the data in response to a level of a reference voltage, wherein the driving of the input data is adjusted in response to the pull-up code and the pull-down code.

In another embodiment, an integrated circuit includes: a first line through which data applied from a memory control circuit is transferred; a first ODT unit configured to receive at least one pull-up code and at least one pull-down code for impedance matching of the first line, and adjust resistance values of a first pull-up driving section and a first pull-down driving section; a second line through which a reference voltage is transferred; and a second ODT unit configured to adjust a second pull-up driving section and a second pull-down driving section which drive the second line in response to the pull-up code and the pull-down code.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
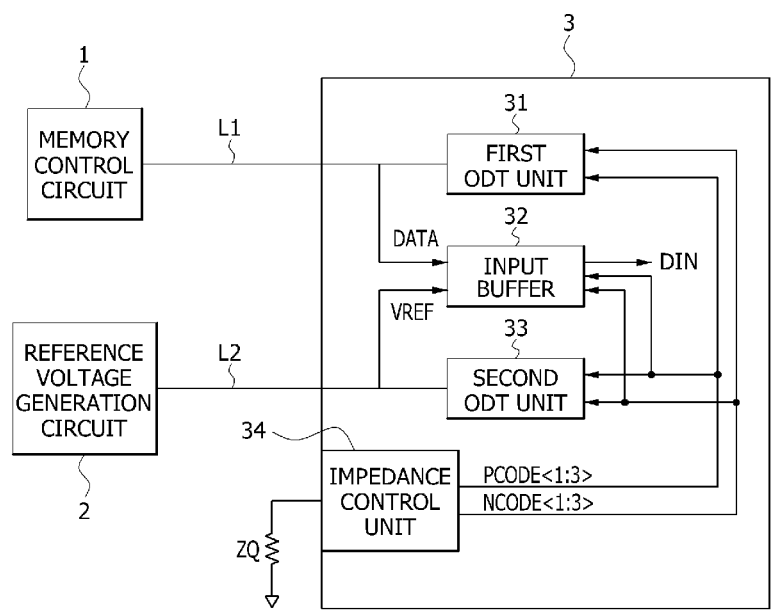
FIG. 1 is a block diagram illustrating a configuration of an integrated circuit according to an embodiment of the present invention.

FIG. 1 is a block diagram illustrating a configuration of an integrated circuit according to an embodiment of the present invention.

As illustrated in FIG. 1, the integrated circuit includes a memory control circuit 1, a reference voltage generation circuit 2, and a semiconductor memory device 3. The memory control circuit 1 is a circuit designed to control the semiconductor memory device 3 and is configured to transfer data DATA through a first line L1. The semiconductor memory device 3 includes a first ODT unit 31, an input buffer 32, a second ODT unit 33, and an impedance control unit 34.

Figure 2:
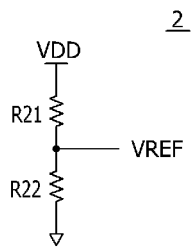
FIG. 2 is a circuit diagram illustrating a reference voltage generation circuit included in the integrated circuit of FIG. 1.

As illustrated in FIG. 2, the reference voltage generation circuit 2 includes resistors R21 and R22 through which a power supply voltage is divided according to a resistance ratio to generate a reference voltage VREF. The reference voltage generation circuit 2 applies the reference voltage VREF to the semiconductor memory device 3 through a second line L2.

Figure 3:
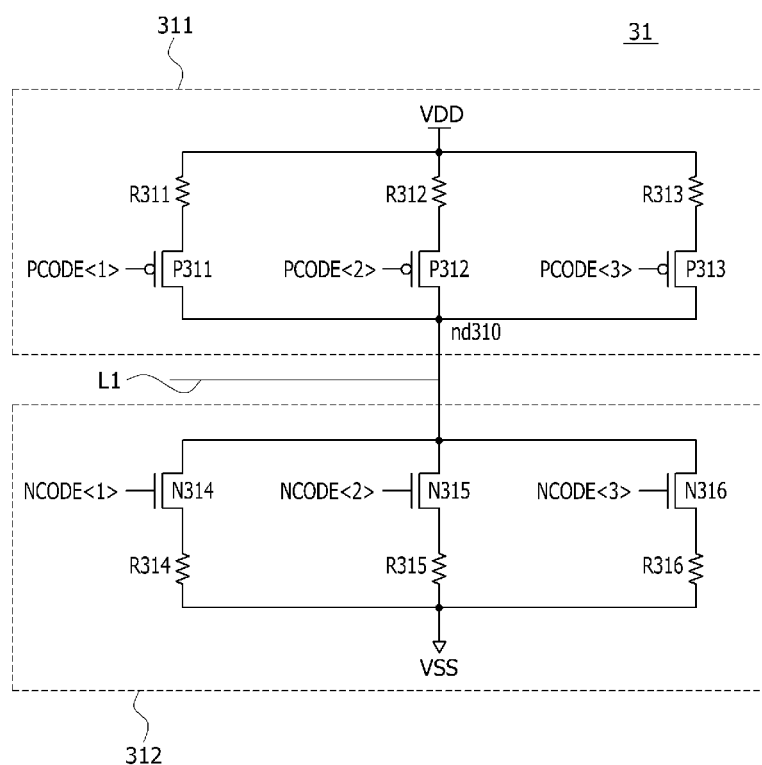
FIG. 3 is a circuit diagram illustrating a first ODT unit included in the integrated circuit of FIG. 1.

As illustrated in FIG. 3, the first ODT unit 31 includes a first pull-up driving section 311 and a first pull-down driving section 312. The first pull-up driving section 311 includes PMOS transistors P311 to P313 and resistors R311 to R313. The PMOS transistors P311 to P313 pull-up drive the first line L1. Transistors P311 to P313 are coupled to the first line L1 and selectively turned on in response to first to third pull-up codes PCODE<1:3>. The resistor R312 may have two times the resistance of the resistor R311, and the resistor R313 may have two times the resistance of the resistor R312.

The first pull-down driving section 312 includes NMOS transistors N314 to N316 and resistors R314 to R316. The NMOS transistors N314 to N316 pull-down drive the first line L1. The transistors N314 to N316 are coupled to the first line L1 and selectively turned on in response to first to third pull-down codes NCODE<1:3>. The resistor R315 may have two times the resistance of the resistor R314, and the resistor R316 may have two times the resistance of the resistor R315.

The first ODT unit 31 is configured to adjust the resistance values of the first pull-up driving section 311 and the first pull-down driving section 312 according to PVT characteristic variation. For example, when the current characteristic of the PMOS transistors P311 to P313 according to the PVT characteristic variation is slow (an amount of current flowing through the transistors is smaller than a typical amount), the first to third pull-up codes PCODE<1:3> are down-counted to decrease the resistance value of the first pull-down driving section 312. When the current characteristic of the NMOS transistors N314 to N316 according to the PVT characteristic variation is fast (an amount of current flowing through the transistors is larger than a typical amount), the first to third pull-down codes NCODE<1:3> are up-counted to decrease the resistance value of the first pull-down driving section 312.

Figure 4:
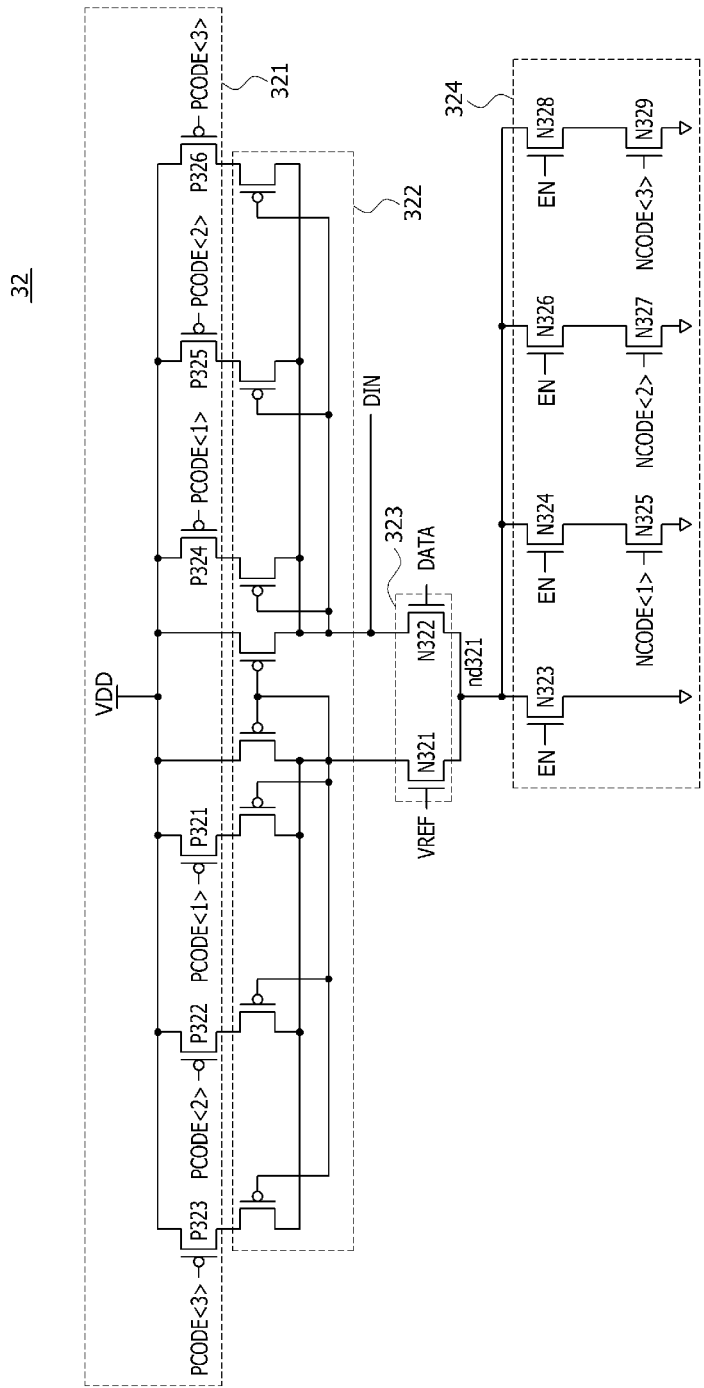
FIG. 4 is a circuit diagram illustrating an input buffer included in the integrated circuit of FIG. 1.

As illustrated in FIG. 4, the input buffer 32 includes a voltage supply unit 321, a current mirror unit 322, a signal input unit 323, and a discharge unit 324. The voltage supply unit 321 includes PMOS transistors P321 to P326 configured to be selectively turned on in response to the first to third pull-up codes PCODE<1:3> to supply a power supply voltage VDD. The current mirror unit 322 is supplied with the power supply voltage from the voltage supply unit 321 and operates as a constant current source.

The signal input unit 323 is coupled to the current mirror unit 322 and configured to buffer the data DATA in response to the level of the reference voltage VREF and determine the level of input data DIN. That is, when the level of the data DATA is lower than that of the reference voltage VREF, the turn-on degree of the NMOS transistor N321 is greater than that of the NMOS transistor N322 and thus the drivability to pull-up drive the input data DIN increases. When the level of the data is higher than that of the reference voltage VREF, the turn-on degree of the NMOS transistor N321 is smaller than that of the NMOS transistor N322 and thus the drivability to pull-down drive the input data DIN increases. The discharge unit 324 includes NMOS transistors N323 to N329 configured to receive a high-level enable signal EN and be selectively turned on in response to the first to third pull-down codes NCODE<1:3> to determine an amount of charge discharged from the signal input unit 323.

The input buffer 32 constantly maintains the level of the power supply voltage supplied from the voltage supply unit 321 and the amount of charge discharged from the discharge unit 324 according to the PVT characteristic variation. For example, when the current characteristic of the PMOS transistors included in the input buffer 32 according to the PVT characteristic variation is slow, the turn-on resistance of the PMOS transistors increases. Thus, the first to third pull-up codes PCODE<1:3> are down-counted to constantly maintain the level of the power supply voltage supplied from the voltage supply unit 321. When the current characteristic of the NMOS transistors comprising the input buffer 32 according to the PVT characteristic variation is fast, the turn-on resistance of the NMOS transistors decreases. Thus, the first to third pull-up codes PCODE<1:3> are up-counted to constantly maintain the amount of charge discharged from the discharge unit 324.

Figure 5:
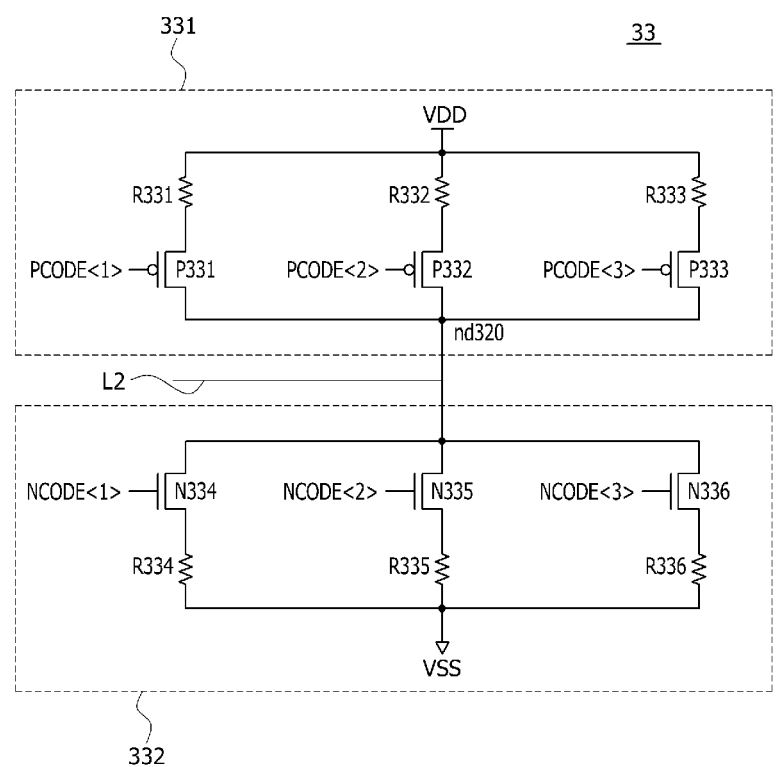
FIG. 5 is a circuit diagram illustrating a second ODT unit included in the integrated circuit of FIG. 1.

As illustrated in FIG. 5, the second ODT unit 33 includes a second pull-up driving section 331 and a second pull-down driving section 332. The second pull-up driving section 331 includes PMOS transistors P331 to P333 and resistors R331 to R333. The PMOS transistors P331 to P333 pull-up drive the second line L2. Accordingly, to drive line L2, the PMOS transistors P331 to P333 are coupled to the second line L2 and selectively turned on in response to the first to third pull-up codes PCODE<1:3>. The resistor R332 may have two times the resistance of the resistor R331, and the resistor R333 may have two times the resistance of the resistor R332.

The second pull-down driving section 332 includes NMOS transistors N334 to N336 and resistors R334 to R336. The NMOS transistors N334 to N336 pull-down drive the second line L2. Accordingly, to drive line L2, the NMOS transistors N334 to N336 are coupled to the second line L2 and selectively turned on in response to the first to third pull-down codes NCODE<1:3> to pull-down drive the second line L2. The resistor R335 may have two times the resistance of the resistor R334, and the resistor R336 may have two times the resistance of the resistor R335.

Like the first pull-up driving section 311 of the first ODT unit 31, the resistance value of the second pull-up driving section 331 of the second ODT unit 33 is adjusted according to the first to third pull-up codes PCODE<1:3>. Like the first pull-down driving section 312 of the first ODT unit 31, the resistance value of the second pull-down driving section 332 of the second ODT unit 33 is adjusted according to the first to third pull-down codes NCODE<1:3>.

Figure 6:
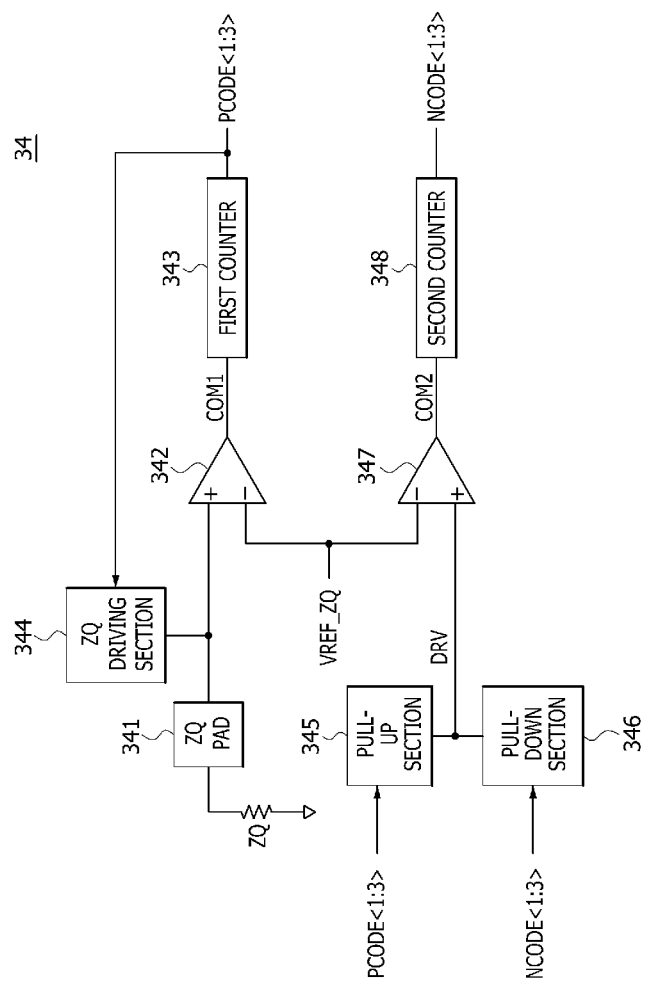
FIG. 6 is a circuit diagram illustrating an impedance control unit included in the integrated circuit of FIG. 1.

As illustrated in FIG. 6, the impedance control unit 34 includes a ZQ pad 341, a first comparator 342, a first counter 343, a ZQ driving section 344, a pull-up section 345, a pull-down section 346, a second comparator 347, and a second counter 348. The ZQ pad 341 is coupled to an external resistor ZQ. The first comparator 342 is configured to compare a level of a signal of the ZQ pad 341 with a level of a ZQ reference voltage VREF_ZQ and generate a first comparison signal COM1. The first counter 343 is configured to up-count or down-count the first to third pull-up codes PCODE<1:3> according to the level of the first comparison signal COM1. The ZQ driving section 344 is configured to pull-up drive the ZQ pad 341 in response to the first to third pull-up codes PCODE<1:3>

The pull-up section 345 is configured to pull-up drive a driving signal DRV in response to the first to third pull-up codes PCODE<1:3>. The pull-down section 346 is configured to pull-down drive the driving signal DRV in response to the first to third pull-down codes NCODE<1:3>. The second comparator 347 is configured to compare the level of the driving signal DRV with the level of the ZQ reference voltage VREF_ZQ and generate a second comparison signal COM2. The second counter 348 is configured to up-count or down-count the first to third pull-down codes NCODE<1:3> according to the level of the second comparison signal COM2. The pull-up section 345 includes PMOS transistors (not shown) and resistors (not shown) configured to be turned on in response to the first to third pull-up codes PCODE<1:3>. The pull-down section 346 includes NMOS transistors (not shown) and resistors (not shown) configured to be turned on in response to the first to third pull-down codes NCODE<1:3>.

Figure 7:
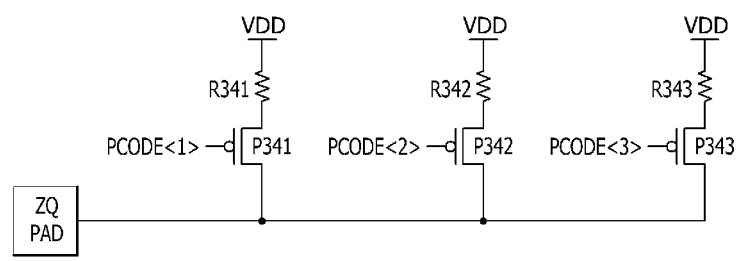
FIG. 7 is a circuit diagram illustrating a ZQ driving section included in the impedance control unit of FIG. 6.

As illustrated in FIG. 7, the ZQ driving section 344 includes PMOS transistors P341 to P343 and resistors R341 to R343. The PMOS transistors P341 to P343 pull-up drive the ZQ pad 341. Accordingly, the PMOS transistors P341 to P343 operate as pull-up elements configured to be selectively turned on in response to the first to third pull-up codes PCODE<1:3>.

The impedance control unit 34 having the above configuration counts the first to third pull-up codes PCODE<1:3> and the first to third pull-down codes NCODE<1:3> according to PVT characteristic variation. For example, when the current characteristic of the PMOS transistors is slow, the first to third pull-up codes PCODE<1:3> are down-counted. When the current characteristic of the NMOS transistors is fast, the first to third pull-up codes NCODE<1:3> are up-counted.

Just as in the first ODT unit, the integrated circuit adjusts the resistance values of the second ODT unit 33 according to PVT characteristic variations. This will be described below in greater detail with reference to FIGS. 8A and 8B.

Figure 8A:
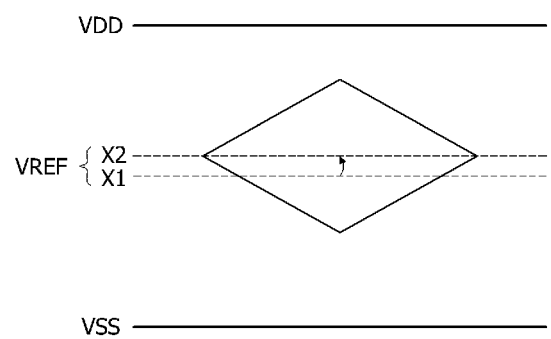
FIGS. 8A and 8B are waveform diagrams of data inputted to the input buffer when driver mismatch of the ODT unit occurs.

As illustrated in FIG. 8A, when the resistance value of the first pull-up driving section 311 of the first ODT is set to be smaller than the resistance value of the first pull-down driving section 312, the waveform of the data DATA is moved toward the power supply voltage VDD. If the reference voltage VREF has a level X1 given when the first pull-up driving section 311 and the first pull-down driving section 312 have the same resistance value, the margin of the data DATA inputted to the input buffer 32 may not be sufficiently ensured. Therefore, the second ODT unit 33 may set the resistance value of the second pull-up driving section 331 to be smaller than the resistance value of the second pull-down driving section 332 thereby raising the level of the reference voltage VREF to X2. In this way, the margin of the data DATA inputted to the input buffer 32 can be sufficiently ensured.

Figure 8B:
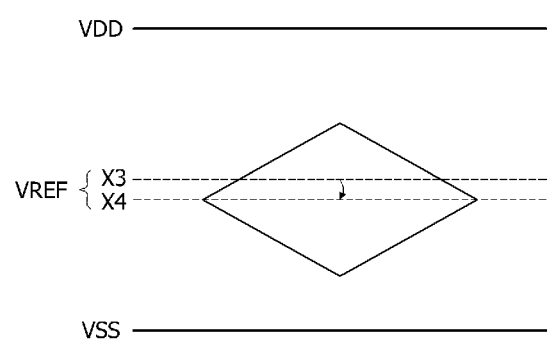

As illustrated in FIG. 8B, when the resistance value of the first pull-up driving section 311 of the first ODT unit 31 is set to be larger than the resistance value of the first pull-down driving section 312, the waveform of the data DATA is moved toward the ground voltage VSS. Therefore, the second ODT unit 33 may set the resistance value of the second pull-up driving section 331 to be larger than the resistance value of the second pull-down driving section 332, thereby lowering the level of the reference voltage VREF from X3 to X4. In this way, the margin of the data DATA inputted to the input buffer 32 can be sufficiently ensured.

Also, in an embodiment, the integrated circuit constantly maintains the level of the power supply voltage supplied from the voltage supply unit 321 and the amount of charge discharged from the discharge unit 324. This is described below in detail with reference to FIGS. 9A and 9B.

Figure 9A:
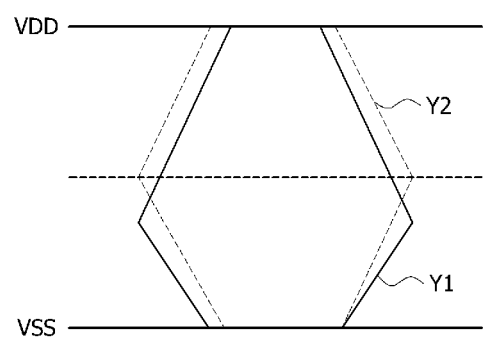
FIGS. 9A and 9B are waveform diagrams of data inputted to the input buffer when PVT characteristic variation occurs.

As illustrated in FIG. 9A, when the current characteristic of the PMOS transistors are slow and the current characteristic of the NMOS transistors are fast, the waveform of the input data DIN outputted from the input buffer 32 is moved toward the ground voltage VSS as indicated by Y1. In such a state, the first to third pull-up codes PCODE<1:3> generated from the impedance control unit 34 are down-counted, and the first to third pull-down codes NCODE<1:3> generated from the impedance control unit 34 are up-counted. The power supply voltage supplied from the voltage supply unit 321 of the input buffer 32 receiving the down-counted first to third pull-up codes PCODE<1:3> is constantly maintained even when the current characteristic of the PMOS transistors changes to slow. Also, the amount of charge discharged from the discharge unit 324 of the input buffer 32 receiving the up-counted first to third pull-down codes NCODE<1:3> is constantly maintained even when the current characteristic of the NMOS transistors changes to fast. Therefore, the waveform of the input data DIN outputted from the input buffer 32 is outputted without distortion as indicated by Y2.

Figure 9B:
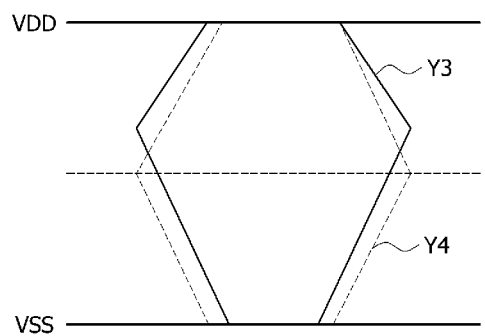

As illustrated in FIG. 9B, when the current characteristic of the PMOS transistors is fast and the current characteristic of the NMOS transistors are slow, the waveform of the input data DIN outputted from the input buffer 32 is moved toward the power supply voltage VDD as indicated by Y3. In such a state, the first to third pull-up codes PCODE<1:3> generated from the impedance control unit 34 are up-counted, and the first to third pull-down codes NCODE<1:3> generated from the impedance control unit 34 are down-counted. The power supply voltage supplied from the voltage supply unit 321 of the input buffer 32 receiving the up-counted first to third pull-up codes PCODE<1:3> is constantly maintained even when the current characteristic of the PMOS transistors changes to fast. Also, the amount of charge discharged from the discharge unit 324 of the input buffer 32 receiving the down-counted first to third pull-down codes NCODE<1:3> is constantly maintained even when the current characteristic of the NMOS transistors changes to slow. Therefore, the waveform of the input data DIN outputted from the input buffer 32 is outputted without distortion as indicated by Y4.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. An integrated circuit comprising:
    a first on-die termination (ODT) configured to receive at least one pull-up code and at least one pull-down code for impedance matching of a first line through which data is transferred, and adjust a resistance value; and
    an input buffer configured to receive the pull-up code and the pull-down code, and drive input data by buffering the data in response to a level of a reference voltage, wherein the driving of the input data is adjusted in response to the pull-up code and the pull-down code.

2. The integrated circuit of claim 1, wherein the first on-die termination (ODT) unit comprising:
    a pull-up driving section configured to pull-up drive a first line according to a resistance value which is set depending on the pull-up code; and
    a pull-down driving section configured to pull-down drive the first line according to a resistance value which is set depending on the pull-down code.

3. The integrated circuit of claim 1, wherein the input buffer comprises:
    a voltage supply unit configured to supply a power supply voltage through a plurality of switches which are selectively turned on in response to the pull-up code;
    a current mirror unit configured to be supplied with the power supply voltage from the voltage supply unit and operate as a constant current source;
    a signal input unit coupled to the constant current source and configured to receive the reference voltage and the data and determine a level of the input data; and
    a discharge unit configured to determine an amount of charge discharged from the signal input unit in response to the pull-down code.

4. The integrated circuit of claim 1, further comprising:
    a first comparator configured to compare a level of a signal of a first pad, to which an external resistor is coupled, with a level of a ZQ reference voltage and generate a first comparison signal;
    a first counter configured to count the pull-up code in response to the first comparison signal;
    a driving section configured to drive the first pad in response to the pull-up code; a second comparator configured to compare a level of a driving signal with a level of the ZQ reference voltage and generate a second comparison signal; and
    a second counter configured to count the pull-down code in response to the second comparison signal.

5. The integrated circuit of claim 4, wherein the driving signal is produced by at least one of a pull-up section or a pull-down section.

6. The integrated circuit of claim 1, further comprising a second ODT unit configured to receive the pull-up code and the pull-down code and adjust a resistance value.

7. The integrated circuit of claim 6, wherein the resistance values of the first ODT unit and the second ODT unit are equally adjusted in response to the pull-up code and the pull-down code.

8. The integrated circuit of claim 6, wherein the second ODT unit comprises:
a pull-up driving section configured to pull-up drive a second line, through which the reference voltage is transferred, according to a resistance value which is set depending on the pull-up code; and
a pull-down section configured to pull-down drive the second line according to a resistance value which is set depending on the pull-down code.

9. The integrated circuit of claim 1, further comprising a reference voltage generation circuit configured to divide a power supply voltage and generate the reference voltage.

10. An integrated circuit comprising: a first on-die termination (ODT) unit configured to receive at least one pull-up code and at least one pull-down code for impedance matching of a first line, and adjust resistance values of a first pull-up driving section and a first pull-down driving section; a second line for transferring a reference voltage to an input buffer; and a second ODT unit configured to adjust a second pull-up driving section and a second pull-down driving section which drives a voltage at the second line in response to the pull-up code and the pull-down code.

11. The integrated circuit of claim 10, wherein the first pull-up driving section is configured to pull-up drive the first line according to a resistance value which is set depending on the pull-up code.

12. The integrated circuit of claim 10, wherein the first pull-down driving section is configured to pull-down drive the first line according to a resistance value which is set depending on the pull-down code.

13. The integrated circuit 10, wherein the second pull-up driving section is configured to pull-up drive a second line according to a resistance value which is set depending on the pull-up code.

14. The integrated circuit of claim 10, wherein the second pull-down driving section is configured to pull-down drive a second line according to a resistance value which is set depending on the pull-down code.

15. The integrated circuit of claim 10, further comprising an input buffer configured to drive input data by buffering data in response to a level of a reference voltage, wherein the driving of the input data is adjusted in response to the pull-up code and the pull-down code, and wherein the data is applied from a memory control and transferred through a first line, and wherein the reference voltage is transferred through a second line.

16. The integrated circuit of claim 15, wherein the input buffer comprises:
a voltage supply unit configured to supply a power supply voltage through a plurality of switches which are selectively turned on in response to the pull-up code;
a current mirror unit configured to be supplied with the power supply voltage from the voltage supply unit and operate as a constant current source;
a signal input unit coupled to the constant current source and configured to receive the reference voltage and the data and determine a level of the input data; and
a discharge unit configured to determine an amount of charges discharged from the signal input unit in response to the pull-down code.

17. The integrated circuit of claim 10, further comprising:
a first comparator configured to compare a level of a signal of a first pad, to which an external resistor is coupled, with a level of a ZQ reference voltage and generate a first comparison signal;
a first counter configured to count the pull-up code in response to the first comparison signal;
a driving section configured to drive the first pad in response to the pull-up code; a second comparator configured to compare a level of a driving signal of with a level of the ZQ reference voltage and generate a second comparison signal; and
a second counter that counts the pull-down code in response to the second comparison signal.

18. The integrated circuit of claim 17, wherein the driving signal is produced by at least one of a pull-up section or a pull-down section.

19. The integrated circuit of claim 10, wherein the resistance values of the first ODT unit and the second ODT unit are equally adjusted in response to the pull-up code and the pull-down code.

20. The integrated circuit of claim 10, further comprising a reference voltage generation circuit that divides a power supply voltage and generate the reference voltage.

* * * * *